United States Patent
Yan et al.

(10) Patent No.: US 7,362,196 B2
(45) Date of Patent: Apr. 22, 2008

(54) TEMPERATURE COMPENSATION ATTENUATOR

(75) Inventors: Yuejun Yan, Shenzhen (CN); Yuepeng Yan, Shenzhen (CN)

(73) Assignee: Yantel Corporation, Shenzhen (CN)

( * ) Notice: Subject to any disclaimer, the term of this patent is extended or adjusted under 35 U.S.C. 154(b) by 0 days.

(21) Appl. No.: 10/597,985

(22) PCT Filed: Apr. 28, 2005

(86) PCT No.: PCT/CN2005/000586

§ 371 (c)(1),
(2), (4) Date: Aug. 15, 2006

(87) PCT Pub. No.: WO2005/112256

PCT Pub. Date: Nov. 24, 2005

(65) Prior Publication Data

US 2007/0182523 A1    Aug. 9, 2007

(30) Foreign Application Priority Data

May 18, 2004    (CN) .................. 2004 1 0027307

(51) Int. Cl.
*H01P 1/22*    (2006.01)
(52) U.S. Cl. .................. 333/81 R; 333/81 A
(58) Field of Classification Search .............. 333/81 A, 333/81 R
See application file for complete search history.

(56) References Cited

U.S. PATENT DOCUMENTS 5,332,981 A * 7/1994 Mazzochette et al. .... 333/81 R

* cited by examiner

*Primary Examiner*—Stephen E. Jones
(74) *Attorney, Agent, or Firm*—Matthias Scholl P.C.; Matthias Scholl

(57) ABSTRACT

This specification discloses a temperature compensation attenuator comprising a base 6, a film thermistor 1 disposed on the base 6, an input terminal 3 and an output terminal 4 which are connected to the two ends of the film thermistor 1, respectively, and a film resistor 2, wherein the top side of the film resistor 2 is electronically connected to the bottom side of the thermistor 1, and the bottom side of the film resistor 2 is electronically connected to the ground. By connecting the temperature compensation attenuator of the present invention to a high frequency or microwave active circuit, it can compensate for the variance in the gain of the high frequency or microwave active device or the drift of the frequency characteristic of the active device due to temperature variance. The temperature compensation attenuator of the present invention can be used in various circuits and systems utilizing high frequency waves or microwaves, in particular, it is suitable for mobile communication systems, satellite communication systems, and radar systems which require strict temperature characteristics.

18 Claims, 4 Drawing Sheets

TEMPERATURE COMPENSATION ATTENUATOR

CROSS-REFERENCE TO RELATED APPLICATIONS

This is a National Stage Application of International Patent Application Ser. No. PCT/CN 2005/000586, with an international filing date of Apr. 28, 2005, which is based on Chinese Patent Application Ser. No. 200410027307.7, filed May. 18, 2004. The contents of both of these specifications are incorporated herein by reference.

FIELD OF THE INVENTION

The present invention relates to temperature compensation attenuators for compensating temperature characteristics of high frequency or microwave devices and systems used in electronics and communication. The attenuators can be applied in various circuits and systems utilizing high frequency waves or microwaves, and more particularly, are suitable for use in mobile communication systems, satellite communication systems, satellite navigational systems, and radar systems which require strict temperature characteristics.

BACKGROUND OF THE INVENTION

Current techniques for reducing the temperature drift of high frequency or microwave active devices are quite complex, utilize many applied components, and exhibit lengthy R&D periods, high cost, and high rate of failure. For example, the gain of high frequency or microwave power amplifiers, and thus their power output, varies with external temperature, seriously deteriorating the characteristics and stability of the amplifiers and even of the entire systems. To reduce the variance in the gain and the power of high frequency or microwave power amplifiers resulting from the variance in environmental temperature, many active devices, such as temperature detectors, power couplers, wave detectors, programmable signal processors, storage, and preamplifiers with automatic gain control (AGC) and automatic power control (APC) capabilities are included in the amplifiers themselves, their power sources and their control systems.

While resolving the temperature drift characteristics, several features of the devices must be satisfied:
(1) wideband characteristic;
(2) minimal refection coefficient for both the input and the output terminals;
(3) high isolation for both the input and the output terminals;
(4) the characteristic impedance of both the input and the output terminals complies with the requirement of the access system, for example, 50 Ohm or 75 Ohm.

SUMMARY OF THE INVENTION

The objective of the present invention is to provide a temperature compensation attenuator to realize the compensation of the temperature characteristic of high frequency or microwave active devices and systems in electronics and communications.

In one embodiment of the invention described herein provided is a temperature compensation attenuator comprising a base, a film thermistor on the base, an input terminal and an output terminal which are connected to the two ends of the film thermistor respectively, and a film resistor, wherein the top side of the resistor is electronically connected to the bottom side of the thermistor, and the bottom side of the resistor is electronically connected to a ground terminal.

In certain embodiments of the invention, the two ends of the resistor are connected to an input terminal and an output terminal, respectively.

In certain embodiments of the invention, the resistor is a film thermistor with a temperature characteristic opposite to that of the film thermistor on the base.

As a result, by utilizing the film thermistor of the present invention, a wideband temperature compensation attenuator with a distributed parameter circuit structure is constructed wherein the amount of attenuation varies with temperature. By connecting the temperature compensation attenuator of the present invention to a high frequency or microwave active circuit, it can compensate for the variance of the gain of the high frequency or microwave active device or the drift of the frequency characteristic of the active device resulting from temperature variance. Even under large environmental temperature variance, it can still ensure the stability of the gain of the high frequency or microwave active device and compensate for the drift of the frequency characteristic of the active device.

DETAILED DESCRIPTION OF THE INVENTION

Figure 1:
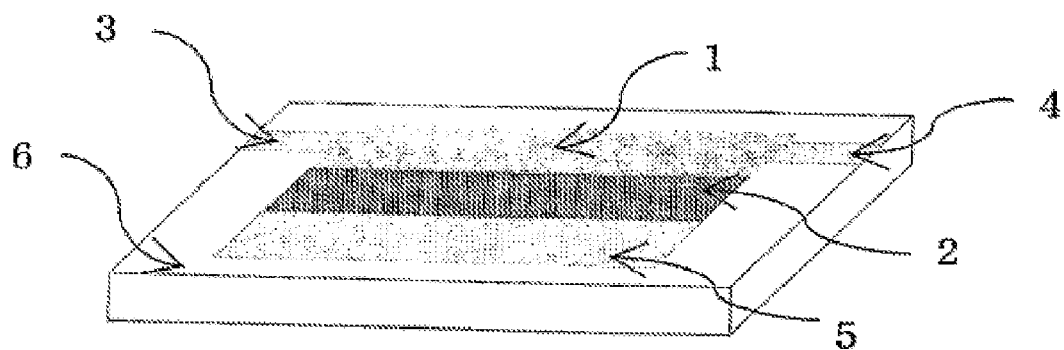
FIG. 1 is a schematic drawing of the temperature compensation attenuator with a distributed parameter circuit structure in accordance with a first preferred embodiment of the present invention.

With reference to FIG. 1, the temperature compensation attenuator in accordance with the first preferred embodiment of the present invention comprises a base 6, a film thermistor 1 disposed on the base 6, wherein the two ends of the film thermistor 1 are connected to an input terminal 3 and an output terminal 4 respectively, the bottom side of the film thermistor 1 is electronically connected to the top side of the film resistor 2 formed on the surface of the base 6, and the bottom side of the film resistor 2 is electronically connected to the ground terminal 5.

In one aspect of the present embodiment, a film thermistor with a temperature characteristic opposite to that of the film thermistor 1 can be selected for the film resistor 2 to realize a better temperature compensation characteristic of the temperature compensation attenuator.

As described hereinafter, the film resistor 2 will be understood to be a film thermistor.

Due to the difference in their resistance values and the temperature coefficients, the formation of the film thermistor 1 and the film resistor 2 on the surface of the base 6 will be realized respectively through masking technology. Firstly, the film thermistor 1 is printed on the base 6, wherein one end of the film thermistor 1 is connected to the input terminal 3, and the opposite end is connected to the output terminal 4; and then the film resistor 2 is printed on the base 6, wherein the top side of the film resistor 2 is electronically connected to the bottom side of the film thermistor 1, and the bottom side of the film resistor 2 is electronically connected to the ground terminal 5. In the end, the surfaces of the film thermistor 1 and the film resistor 2 are coated with protective layer to avoid the invasions of external moisture and dust.

Figure 2:
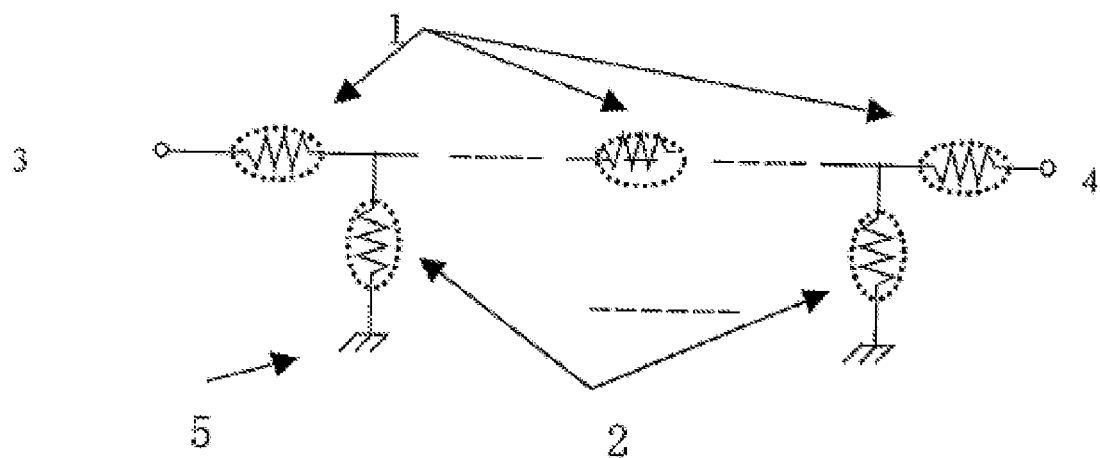
FIG. 2 is a circuit schematic drawing of the temperature compensation attenuator of FIG. 1.

FIG. 2 illustrates the circuit schematic drawing of the distributed parameters of the temperature compensation attenuator of FIG. 1. As shown in FIG. 2, the combination of the film thermistor 1 and the film resistor 2 can be equivalent to a two port resistor network constructed with numerous tiny series and parallels. According to the required compensation amount of gain temperature (that is the required amount of attenuation, isolation, and reflection coefficient of the two port network at different temperatures), the resistance value of the unit's width and length, and the temperature coefficient of the film thermistor 1 and film resistor 2 are determined. It is clear from the calculation that, to obtain a temperature compensation attenuator with a small reflection coefficient and a high isolation of the output and input terminals, the temperature coefficient of the film thermistor 1 and that of the film resistor 2 of the temperature compensation attenuator needs to have different characteristics with respect to the temperature variance. If both the film thermistor 1 and the film resistor 2 have the same positive or the same negative temperature coefficient, the solution would not comply with the requirement to obtain a temperature compensation attenuator with a small reflection coefficient and a high isolation of the output and input terminals.

In the present embodiment, for temperature compensation of a high frequency or microwave active device having a decreasing gain and power with the increase in temperature, in order to keep the gain and the power free from the temperature variance, a thermistor with a negative temperature coefficient (wherein the resistance value decreases with the increase of the temperature) is adopted for the film thermistor 1, while a thermistor with a positive temperature coefficient (wherein the resistance value increases with the increase of the temperature) is adopted for the film resistor 2.

In the present embodiment, as the temperature increases, for temperature compensation of a high frequency or microwave active device having an increasing gain and power with the increase in temperature, in order to keep the gain and the power free from the temperature variance, a thermistor with a positive temperature coefficient (wherein the resistance value increases with the increase of temperature) is adopted for the film thermistor 1, while a thermistor with a negative temperature coefficient (wherein the resistance value decreases with the increase of temperature) may be adopted for the film resistor 2.

In the present embodiment, as the temperature varies, for the temperature compensation attenuator to operate wherein the required compensation of the attenuation is small, the absolute value of the temperature coefficient of the film thermistor 1 that is much greater than that of the film resistor 2 is required.

In the present embodiment, as the temperature varies, for the temperature compensation attenuator to operate wherein the required compensation of the attenuation is large, the absolute value of the temperature coefficient of the film thermistor 1 that is about equal to that of the film resistor 2 is required.

Based on the package structure of the electrode, a surface mount type temperature compensation attenuator can be made, while a pin leg lead type and a patch cord type are also feasible.

The characteristic impedance of the input and output terminals need to be designed to comply with that required by the access system, e.g., 50 Ohm.

Figure 3:
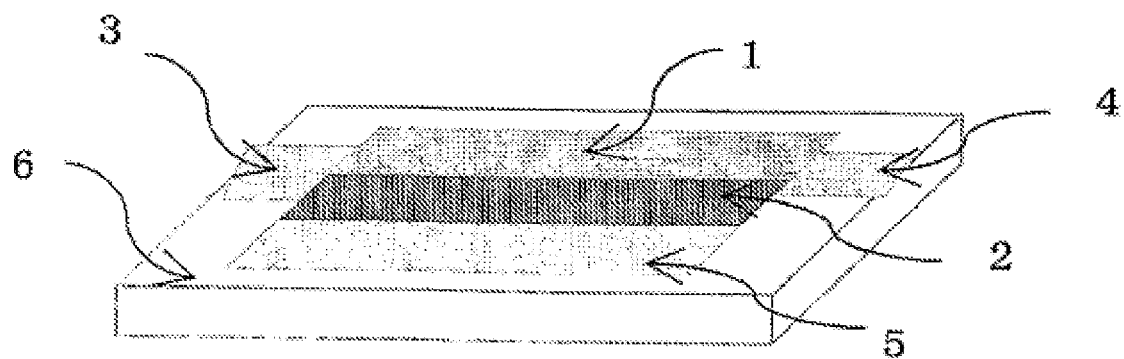
FIG. 3 is a schematic drawing of the temperature compensation attenuator with a distributed parameter circuit structure in accordance with a second preferred embodiment of the present invention.

With reference to FIG. 3, the difference of the temperature compensation attenuator in accordance with a second preferred embodiment of the present invention with that of the first preferred embodiment described hereinbefore is that the two ends of the film resistor 2 are connected to the input terminal 3 and the output terminal 4, respectively.

The specific fabrication method is essentially the same as that described in the first preferred embodiment.

The temperature compensation attenuator in accordance with the second preferred embodiment of the present invention, comprises a base 6, a film thermistor 1 formed on the surface of the base 6, wherein the two ends of the film thermistor 1 are connected to an input terminal 3 and an output terminal 4, respectively, the bottom side of the film thermistor 1 is electronically connected to the top side of the film resistor 2 formed on the surface of the base 6, the bottom side of the film resistor 2 is electronically connected to the ground terminal 5, and the two ends of the film resistor 2 are also connected to the input terminal 3 and the output terminal 4, respectively.

In one aspect of the present embodiment, a film thermistor with a temperature characteristic opposite to that of the film thermistor 1 can be selected for the film resistor 2 in order to realize a better temperature compensation characteristic of the temperature compensation attenuator.

Due to their difference in the resistance value and the temperature coefficient, the formation of the film thermistor 1 and the film resistor 2 on the surface of the base 6 will be realized respectively through masking technology. Firstly, the film thermistor 1 is printed on the base 6, wherein one end of the film thermistor 1 is connected to the input terminal 3, and the opposite end is connected to the output terminal 4; and then the film resistor 2 is printed on the base 6, wherein the top side of the film resistor 2 is electronically connected to the bottom side of the film thermistor 1, and the bottom side of the film resistor 2 is electronically connected to the ground terminal 5; and the two ends of the film resistor 2 are also connected to the input terminal 3 and the output terminal 4, respectively. In the end, the surfaces of the film thermistor 1 and the film resistor 2 are coated with a protective layer to avoid the invasions of external moisture and dust.

Figure 4:
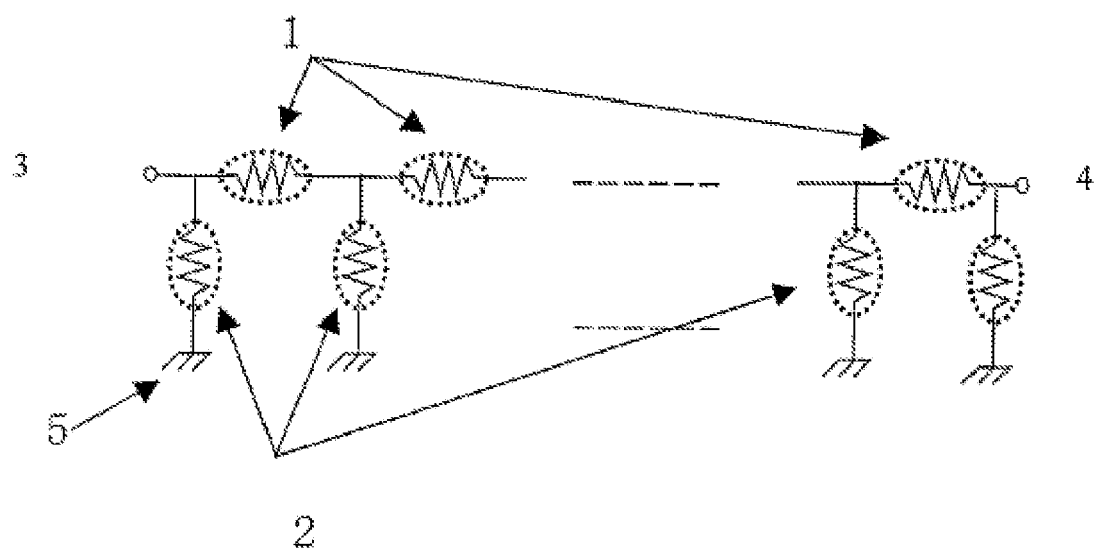
FIG. 4 is a circuit schematic drawing of the temperature compensation attenuator of FIG. 3.

FIG. 4 illustrates the circuit schematic drawing of the distributed parameters of the temperature compensation attenuator of FIG. 3. As shown in FIG. 4, the combination of the film thermistor 1 and the film resistor 2 can be equivalent to a two port resistor network constructed by numerous tiny series and parallels. According to the required compensation amount of gain temperature (that is the required amount of attenuation, isolation, and reflection coefficient of the two port network at different temperatures), the resistance value of the unit's width and length, and the temperature coefficient of the film thermistor 1 and film resistor 2 are determined. In order to obtain a temperature compensation attenuator with a small reflection coefficient and a high isolation of the output and input terminals, the temperature coefficient of the film thermistor 1 and that of the film resistor 2 of the temperature compensation attenuator need to have different characteristics with respect to the temperature variance. If both the film thermistor 1 and the film resistor 2 have the same positive or the same negative temperature coefficient, the solution would not comply with the requirement to obtain a temperature compensation attenuator with a small reflection coefficient and a high isolation of the output and input terminals.

In the present embodiment, for temperature compensation of a high frequency or microwave active device having a decreasing gain and power with the increase in temperature, in order to keep the gain and the power free from the temperature variance, a thermistor with a negative temperature coefficient (wherein the resistance value decreases with the increase of the temperature) is adopted for the film thermistor 1, while a thermistor with a positive temperature coefficient (wherein the resistance value increases with the increase of the temperature) is adopted for the film resistor 2.

In the present embodiment, for temperature compensation of the high frequency or microwave active device having an increasing gain and power with the increase in temperature, in order to keep the gain and the power free from the temperature variance, a thermistor with a positive temperature coefficient (wherein the resistance value increases with the increase of temperature) is adopted for the film thermistor 1, while a thermistor with a negative temperature coefficient (wherein the resistance value decreases with the increase of temperature) is adopted for the film resistor 2.

In the present embodiment, as the temperature varies, for the temperature compensation attenuator to operate wherein the required compensation of the attenuation is small, the absolute value of the temperature coefficient of the film thermistor 1 that is much smaller than that of the film resistor 2 is required.

In the present embodiment, as the temperature varies, for the temperature compensation attenuator to operate wherein the required compensation of the attenuation is large, the absolute value of the temperature coefficient of the film thermistor 1 that is about equal to that of the film resistor 2 is required.

The characteristic impedance of the input and output terminals need to be designed to comply with that required by the access system, e.g., 50 Ohm.

Figure 5:
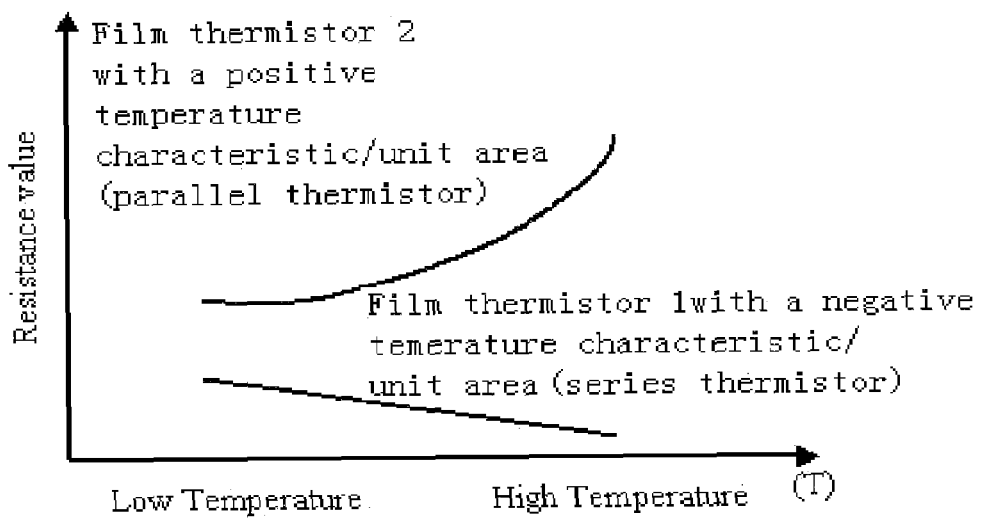
FIG. 5 is a theoretical curve of the resistance value of the thermistor in series and the resistance value of the thermistor in parallel under ideal conditions with the temperature variance of the present invention.

FIG. 5 illustrates the theoretical curve of the resistance value per unit area of the film thermistor 1 with a negative temperature characteristic, and the resistance value per unit area of the film resistor 2 with a positive temperature characteristic. The temperature coefficient of the thermistor in series, that is of the film thermistor 1, needs to have a temperature characteristic opposite to that of the thermistor in parallel, that is of the film resistor 2.

Figure 6:
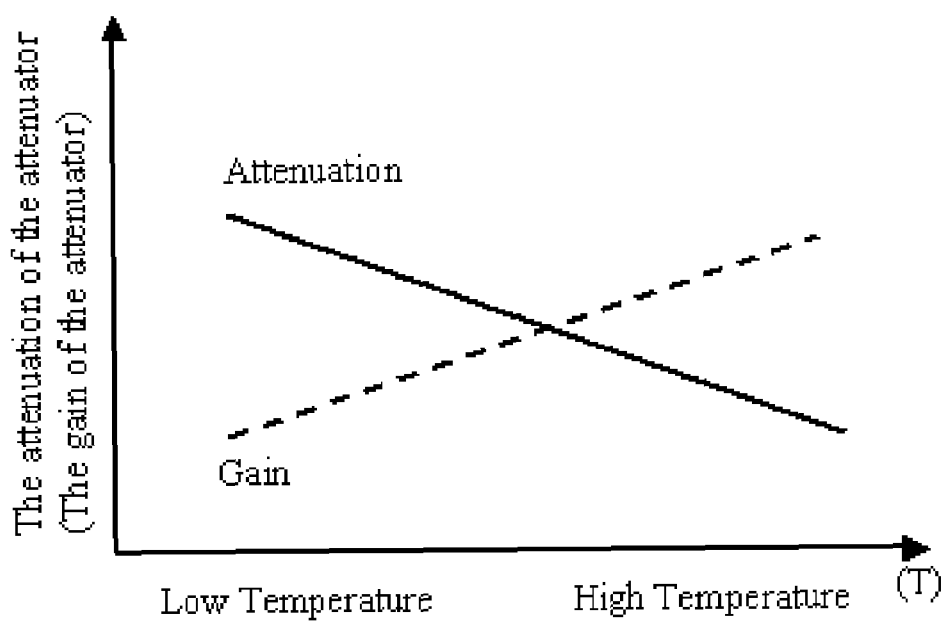
FIG. 6 is a curve of the amount of attenuation or gain when expressed by gain of the temperature compensation attenuator with the temperature variance of the present invention.

FIG. 6 illustrates the curve of the amount of attenuation or gain, when expressed by gain, of the temperature compensation attenuator relative to the temperature variance plotted in correspondence to the curve of FIG. 5. When designing and manufacturing a temperature compensation attenuator, by selecting the thermistor in series, that is the film thermistor 1, and the thermistor in parallel, that is the film resistor 2, having characteristics in accordance with the curve of FIG. 5, the required variance of the attenuation of the temperature compensation attenuator with the temperature variance is realized.

Figure 7:
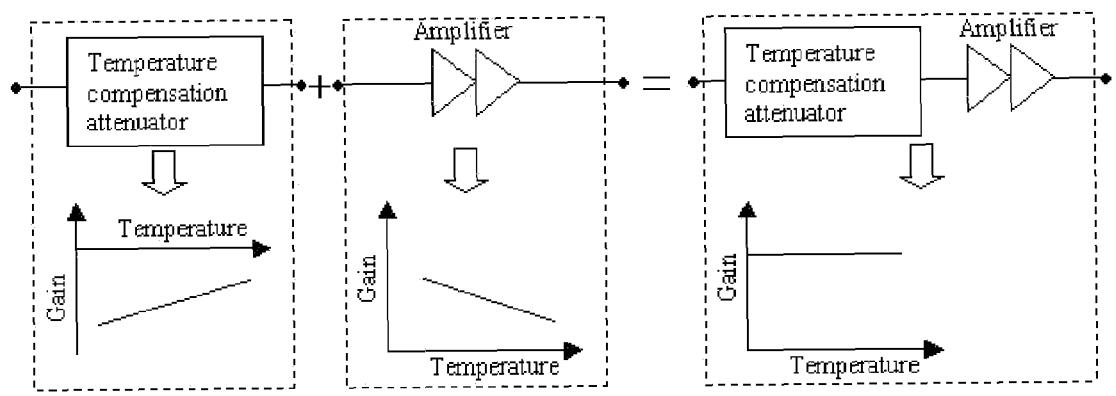
FIG. 7 is a schematic drawing of the variance of the gain of the amplifier where the temperature compensation attenuator is coupled in front of the device of the present invention.

FIG. 7 illustrates the variance of the gain of the amplifier where the temperature compensation attenuator is coupled in front of a device. If the temperature increases, the gain of the amplifier will decrease, and since the temperature compensation attenuator is coupled into the system, the gain of the amplifier will be compensated, and thus a power system with a stable gain is constructed. Even under the conditions of varying environmental temperature, the gain and power output of the device such as the amplifier can be maintained free from the effects of the environmental temperature, namely, by swapping part of the gain for the stability of the system.

Figure 8:
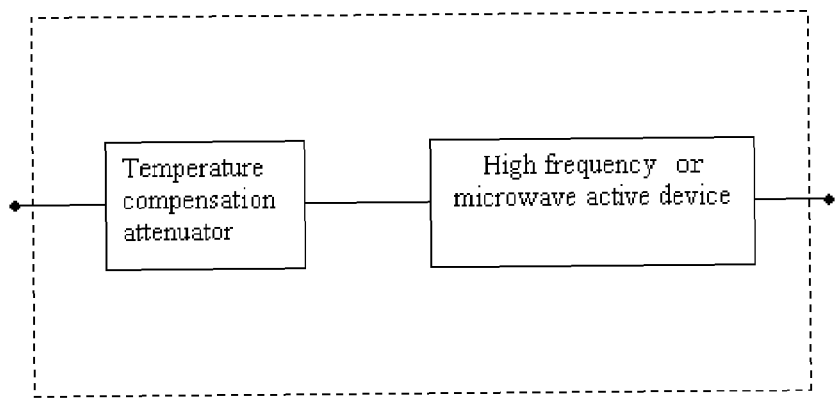
FIG. 8 is a schematic drawing of the active device where the temperature compensation attenuator is coupled in front of the device of the present invention.

FIG. 8 illustrates an active device where the temperature compensation attenuator is coupled in front of the device. Like with the amplifier, the temperature compensation attenuator can also be connected to other high frequency or microwave active devices, by coupling it, for example, in front of a high frequency or microwave diode power detector or a microwave attenuator, so that the drift of temperature characteristic of the high frequency or microwave active device can also be compensated.

In the preferred embodiments, it is understandable that the geometries of the film thermistor 1 and the film resistor 2 are not limited to a quadrangle. The form of the contact side of the film thermistor 1 with the film resistor 2 is not limited to single side contact. For example, in certain embodiment, one side of the film thermistor 1 is electronically contacted with multisides of the film resistor 2, multisides of the film thermistor 1 are electronically contacted with one side of the film resistor 2, or multisides of the film thermistor 1 are electronically contacted with multisides of the film resistor 2, and so on.

In the preferred embodiments hereinbefore, the film thermistor 1, the film resistor 2, the input terminal 3, the output terminal 4, and the ground terminal 5 are without limitation in the same plane; they can also be in different planes.

The present invention discloses a temperature compensation attenuator with the gain and power level having a distributed parameter circuit structure. By connecting the temperature compensation attenuator of the present invention to a high frequency or a microwave active circuit, the variance of the gain of the high frequency or microwave active device or the drift of the frequency characteristic (RF) of the active device due to temperature variations is compensated. Even under adverse environmental temperature variance, an attenuator can ensure the stability of the gain of the high frequency or microwave active device or compensate the drift of the frequency characteristic (RF) of the active device.

The temperature compensation attenuator of the present invention provides the following advantages:

(1) It is an extremely wide band, a minimal reflection coefficient, and a preferable isolation performance.
(2) The passive characteristic offers the features of low cost, small size, simple process of manufacture, and good reliability, and is suitable for the terminal ends of light mobile communication.
(3) It does not need complicated control mode and device, and is easy and convenient to operate. For example, in order to compensate the variance of the gain or power of the high frequency or microwave power amplifier due to the temperature variance, the variation of the gain or power between the high temperature and the low temperature only needs to be measured. As required, the corresponding temperature compensation attenuator can be coupled in the front or in the back or even within the power amplifier and can compensate exactly for the variations of the gain or power.

(4) It is not needed to solve the synchronization problem of the signal.

(5) It is quite suitable for outdoor communication equipments or in adverse weather conditions, such as for a repeater of mobile communication, a tower amplifier of broadcast television, common antenna equipments, a high range frequency head of a satellite receiver, satellite navigation (GPS), wireless link (WLAN), and so on.

(6) It is suitable for the compensation of the variance of the gain or power of a hot power device, such as the variance of the gain or power due to the short term and long term hot status following the start up of a transmitter in a base station for mobile communications.

(7) It is suitable for an instrument or tester having a strict requirement on the indoor temperature variance.

(8) In accordance with the requirement of system installation, besides the surface mount type for the temperature compensation attenuator of the present invention, the pin leg lead type and the patch cord type are also offered.

What is claimed is:

1. A temperature compensation attenuator comprising
a base 6;
a film thermistor 1 having two ends, having a top side and a bottom side, and being disposed on said base 6;
a film resistor 2 having two ends, and having a top side and a bottom side;
an input terminal 3;
an output terminal 4; and
a ground terminal 5; wherein
said input terminal 3 and said output terminal 4 are connected to said two ends of said film thermistor 1;
the top side of the film resistor 2 is electronically connected to the bottom side of the film thermistor 1;
the bottom side of the film resistor 2 is electronically connected to the ground terminal 5; and
said film resistor 2 is not a thermistor.

2. A temperature compensation attenuator comprising
a base 6;
a film thermistor 1 having two ends, having a top side and a bottom side, and being disposed on said base 6;
a film resistor 2 having two ends, and having a top side and a bottom side;
an input terminal 3;
an output terminal 4; and
a ground terminal 5; wherein
said input terminal 3 and said output terminal 4 are connected to said two ends of said film thermistor 1;
the top side of the film resistor 2 is electronically connected to the bottom side of the film thermistor 1;
the bottom side of the film resistor 2 is electronically connected to the ground terminal 5;
the resistance of said film thermistor 1 varies with temperature; and
the resistance of said film resistor 2 is substantially constant over a temperature range.

3. The attenuator of claim 2, wherein said attenuator is integrated on the base 6 by printing the film thermistor using multilayer masking technology.

4. The attenuator of claim 2, wherein the configuration of said attenuator is one of a surface mount type, a pin leg lead type, or a patch cord type.

5. The attenuator of claim 2, wherein said film thermistor 1 and said film resistor 2 are configured in series, in parallel, or in combination.

6. The attenuator of claim 2, wherein said film thermistor 1 having multiple sides contacts with said film resistor 2 having multiple sides in one of the following manners: one side of said film thermistor 1 is electronically contacted with multiple sides of the film resistor 2, multiple sides of said film thermistor 1 are electronically contacted with one side of said film resistor 2, or multiple sides of said film thermistor 1 are electronically contacted with multiple sides of said film resistor 2.

7. The attenuator of claim 6, wherein film thermistor 1, said film resistor 2, said input terminal 3, said input terminal 4, and said ground terminal 5 are disposed in the same plane or in different planes.

8. The attenuator of claim 2, wherein said film resistor 2 is a film thermistor having a temperature characteristics opposite to the film thermistor 1.

9. The attenuator of claim 8, wherein said film thermistor 1 has a negative temperature coefficient, and said film resistor 2 has a positive temperature coefficient.

10. The attenuator of claim 8, wherein said film thermistor 1 has a positive temperature coefficient, and said film resistor 2 has a negative temperature coefficient.

11. The attenuator according to claim 8, wherein the resistance value and the temperature coefficient of said film thermistor 1 and said film resistor 2 are selected in accordance with the compensation of the gain and the power level in order to satisfy the requirement for the size of the attenuation, isolation, and reflection coefficients.

12. A temperature compensation attenuator comprising
a base 6;
a film thermistor 1 having two ends, having a top side and a bottom side, and being disposed on said base 6;
a film resistor 2 having two ends, and having a top side and a bottom side; an input terminal 3;
an output terminal 4; and
a ground terminal 5; wherein
said input terminal 3 and said output terminal 4 are connected to said two ends of said film thermistor 1;
the top side of the film resistor 2 is electronically connected to the bottom side of the film thermistor 1;
the bottom side of the film resistor 2 is electronically connected to the ground terminal 5; and
said two ends of said film resistor 2 are connected to the input terminal 3 and the output terminal 4, respectively.

13. The attenuator of claim 12, wherein said film resistor 2 is a film thermistor having a temperature characteristic opposite to that of the film thermistor 1.

14. The attenuator of claim 12, wherein said film thermistor 1 and said film resistor 2 are configured in series, in parallel, or in combination.

15. The attenuator of claim 12, wherein the configuration of said attenuator is one of a surface mount type, a pin leg lead type, or a patch cord type.

16. The attenuator of claim 12, wherein said attenuator is integrated on the base 6 by printing the film thermistor using multilayer masking technology.

17. The attenuator of claim 12, wherein said film thermistor 1 having multiple sides contacts with said film resistor 2 having multiple sides in one of the following manners: one side of said film thermistor 1 is electronically contacted with multiple sides of the film resistor 2, multiple sides of said film thermistor 1 are electronically contacted with one side of said film resistor 2, or multiple sides of said film thermistor 1 are electronically contacted with multiple sides of said film resistor 2.

18. The attenuator of claim 17, wherein said film thermistor 1, said film resistor 2, said input terminal 3, said output terminal 4, and said ground terminal 5 are disposed in the same plane or in different planes.

* * * * *